(12) United States Patent
Gambe

(10) Patent No.: US 9,841,671 B2
(45) Date of Patent: Dec. 12, 2017

(54) STORAGE CONTAINER

(71) Applicant: MURATA MACHINERY, LTD., Kyoto-shi, Kyoto (JP)

(72) Inventor: Masahiko Gambe, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 47 days.

(21) Appl. No.: 14/901,956

(22) PCT Filed: Jun. 5, 2014

(86) PCT No.: PCT/JP2014/064980
§ 371 (c)(1),
(2) Date: Dec. 29, 2015

(87) PCT Pub. No.: WO2015/001906
PCT Pub. Date: Jan. 8, 2015

(65) Prior Publication Data
US 2016/0202604 A1    Jul. 14, 2016

(30) Foreign Application Priority Data

Jul. 3, 2013  (JP) .................................. 2013-139795

(51) Int. Cl.
*G03F 1/66* (2012.01)
*H01L 21/673* (2006.01)

(52) U.S. Cl.
CPC .......... *G03F 1/66* (2013.01); *H01L 21/67346* (2013.01); *H01L 21/67359* (2013.01); *H01L 21/67393* (2013.01)

(58) Field of Classification Search
CPC ......... H01L 21/67393; H01L 21/67359; H01L 21/67346; G03F 1/66
(Continued)

(56) References Cited

U.S. PATENT DOCUMENTS 5,346,518 A * 9/1994 Baseman ................. B65G 1/00
206/204
6,176,023 B1 * 1/2001 Doche ............... H01L 21/67353
34/107
(Continued)

FOREIGN PATENT DOCUMENTS

EP      0617573 A1     9/1994
JP      4215079 B2    11/2008
(Continued)

OTHER PUBLICATIONS

Extended Search Report dated Jan. 3, 2017, issued on corresponding European Patent Application No. 14819677.7.

*Primary Examiner* — Timothy L Maust
*Assistant Examiner* — Andrew Schmid
(74) *Attorney, Agent, or Firm* — DLA Piper LLP (US)

(57) ABSTRACT

A storage container in which a uniform flow velocity of the purge gas can be achieved is provided with a plurality of stages of storage units each having an accommodating region to accommodate an article. A supply portion supplies a purge gas; a duct portion communicates with other duct portions of other storage units and serves as a flow path for the purge gas supplied from the supply portion; and an introducing portion communicably connects the duct portion with the accommodating region and introduces the purge gas to the accommodating region. In the flow path for the purge gas in the duct portion, a diffusion member is arranged.

5 Claims, 11 Drawing Sheets

(58) Field of Classification Search
USPC .......................................................... 141/98
See application file for complete search history.

(56) References Cited

U.S. PATENT DOCUMENTS

| | | | |
|---|---|---|---|
| 7,726,353 B2 * | 6/2010 | Okabe | H01L 21/67017 141/51 |
| 2002/0124906 A1 | 9/2002 | Suzuki et al. | |
| 2004/0182472 A1 | 9/2004 | Aggarwal | |
| 2004/0187451 A1 | 9/2004 | Suzuki et al. | |
| 2006/0112882 A1 | 6/2006 | Suzuki et al. | |
| 2006/0112883 A1 | 6/2006 | Suzuki et al. | |
| 2006/0115593 A1 | 6/2006 | Suzuki et al. | |
| 2006/0185597 A1 | 8/2006 | Suzuki et al. | |
| 2006/0185598 A1 | 8/2006 | Suzuki et al. | |
| 2007/0032079 A1 | 2/2007 | Suzuki et al. | |
| 2008/0023417 A1 | 1/2008 | Yamamoto | |
| 2013/0192524 A1 * | 8/2013 | Wu | H01L 21/673 118/719 |
| 2016/0276190 A1 * | 9/2016 | Smith | H01L 21/67393 |

FOREIGN PATENT DOCUMENTS

| | | |
|---|---|---|
| WO | 2006058310 A1 | 6/2006 |
| WO | 2012133441 A1 | 10/2012 |
| WO | 2013015481 A1 | 1/2013 |

* cited by examiner

STORAGE CONTAINER

CROSS REFERENCE TO RELATED APPLICATIONS

This application is a national stage of international application no. PCT/JP2014/064980 filed on Jun. 5, 2014, and claims the benefit of priority under 35 USC 119 of Japanese application no. 2013-139795, filed on Jul. 3, 2013, which are incorporated herein by reference.

TECHNICAL FIELD

The present invention relates to a storage container.

BACKGROUND ART

Reticles used for exposing semiconductors, for example, to light need to be maintained in a clean condition for protection from dust and dirt when being conveyed or stored. Thus, in a storage container for storing reticles, a purge gas (clean gas) is supplied thereinto (see Patent Literature 1, for example).

CITATION LIST

Patent Literature

[Patent Literature 1] Japanese Patent No. 4215079

SUMMARY OF INVENTION

Technical Problem

Examples of the storage container include a storage container in which storage units each configured to accommodate a reticle are vertically stacked in a plurality of stages. In such a storage container, generally, a purge gas is supplied thereinto from a supply portion, and the purge gas is supplied to each storage unit through a flow path that is vertically provided across the stages. In this case, in the storage container, the flow velocity of the purge gas is high in sections near the supply portion, and the flow velocity of the purge gas decreases in sections apart from the supply portion. Consequently, in the storage container, the flow velocity of the purge gas becomes nonuniform, so that variations may occur in the purge gas atmosphere in the storage unit.

The present invention aims to provide a storage container in which a uniform flow velocity of the purge gas can be achieved.

Solution to Problem

A storage container according to one aspect of the present invention is provided with a plurality of stages of storage units each having an accommodating region to accommodate an article. The storage container includes: a supply portion configured to supply a purge gas; a duct portion configured to communicate with one another throughout the plurality of storage units and serve as a flow path for the purge gas supplied from the supply portion when the plurality of storage units are stacked; and an introducing portion configured to communicably connect the duct portion with the accommodating region and introduce the purge gas to the accommodating region. In the flow path for the purge gas in the duct portion, a diffusion member is arranged.

In this storage container, the diffusion member is arranged in the flow path for the purge gas in the duct portion. Accordingly, in the storage container, the purge gas is diffused by the diffusion member. Because of this, in the storage container, the flow velocity can be reduced by, for example, arranging the diffusion member in a section where the flow velocity is high. Thus, in the storage container, a uniform flow velocity of the purge gas can be achieved. Consequently, in the storage container, the purge gas spreads over a wide area even in a section where the flow velocity is generally high, and thus variations in the purge gas atmosphere can be reduced in each storage unit.

In one embodiment, the diffusion member may be a plate-like member protruding from an inner wall of the duct portion. With this member, in the storage container, the purge gas can be diffused by a simple configuration, and thus a uniform flow velocity of the purge gas can be achieved with the simple configuration.

In one embodiment, the diffusion member may be arranged on an extended line in an inflow direction of the purge gas supplied from the supply portion. The flow velocity of the purge gas is high in the inflow direction from the supply portion. Thus, by arranging the diffusion member on the extended line in the inflow direction of the purge gas, the purge gas can be effectively diffused, whereby a uniform flow velocity can be achieved.

In one embodiment, the diffusion member may be provided in at least one of the storage units arranged near the supply portion. The flow velocity of the purge gas is high in a section near the supply portion, and the flow velocity decreases in a section apart from the supply portion. In the storage container, the diffusion member is provided in at least one of the storage units arranged near the supply portion. Accordingly, in the storage container, by diffusing the purge gas with the diffusion member, the flow velocity of the purge gas in the section near the supply portion can be reduced. Thus, in the storage container, a uniform flow velocity the purge gas can be suitably achieved.

In one embodiment, the diffusion member may have an area that is changed depending on a distance from the supply portion. As described above, the flow velocity of the purge gas is high in a section near the supply portion, and flow velocity decreases in a section apart from the supply portion. In the storage container, for example, by increasing the area of the diffusion member arranged in a position near the supply portion, the purge gas can be more effectively diffused. Consequently, in the storage container, a uniform flow velocity of the purge gas can be suitably achieved.

Advantageous Effects of Invention

According to the present invention, a uniform flow velocity of the purge gas can be achieved.

DESCRIPTION OF EMBODIMENTS

Preferred embodiments of the present invention will be described in detail hereinafter with reference to the attached drawings. In the description of the drawings, like reference signs are given to like or equivalent elements, and duplicated explanation is omitted.

Figure 1:
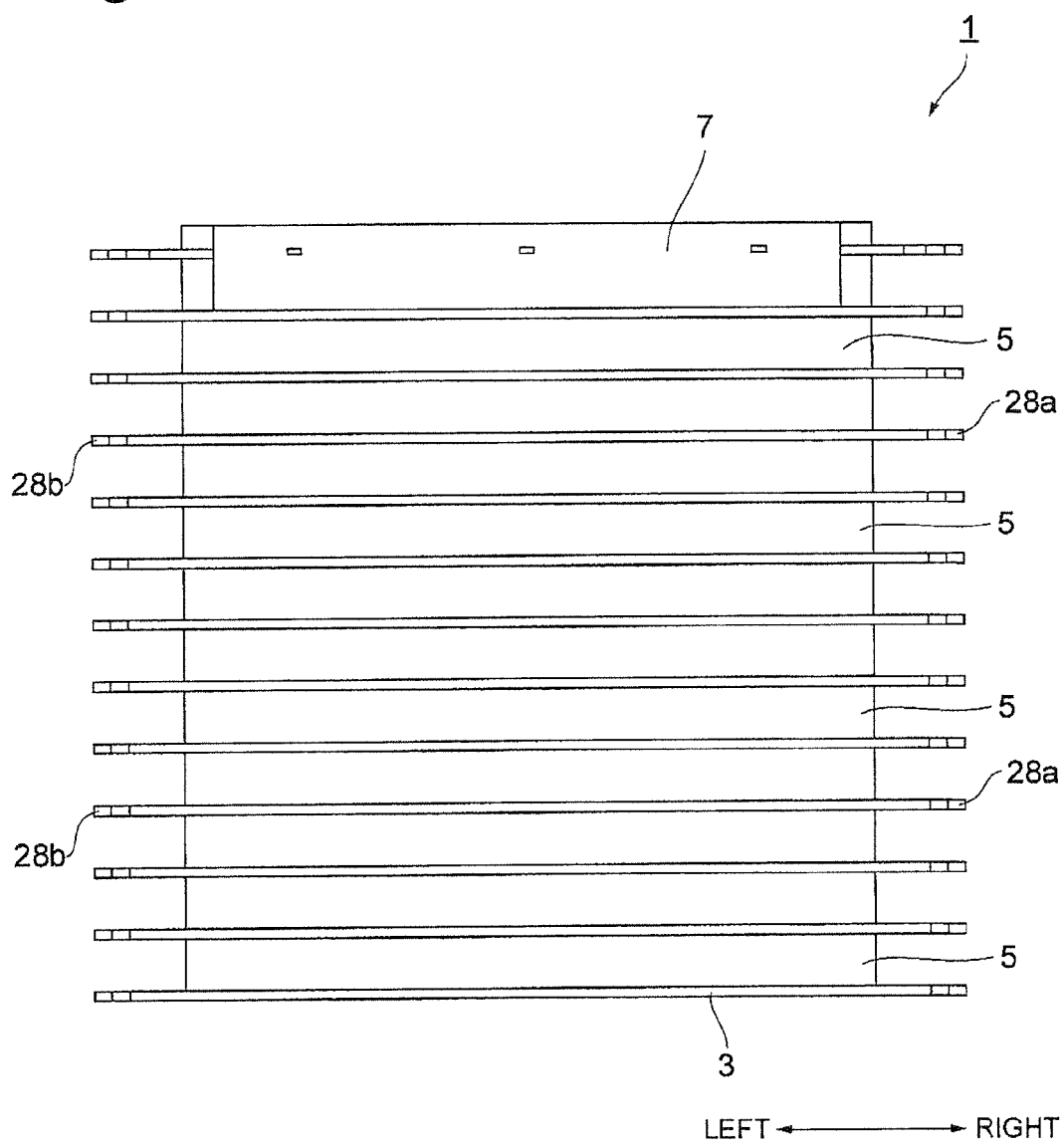
FIG. 1 is a front view of a storage container according to one embodiment.
Figure 2:
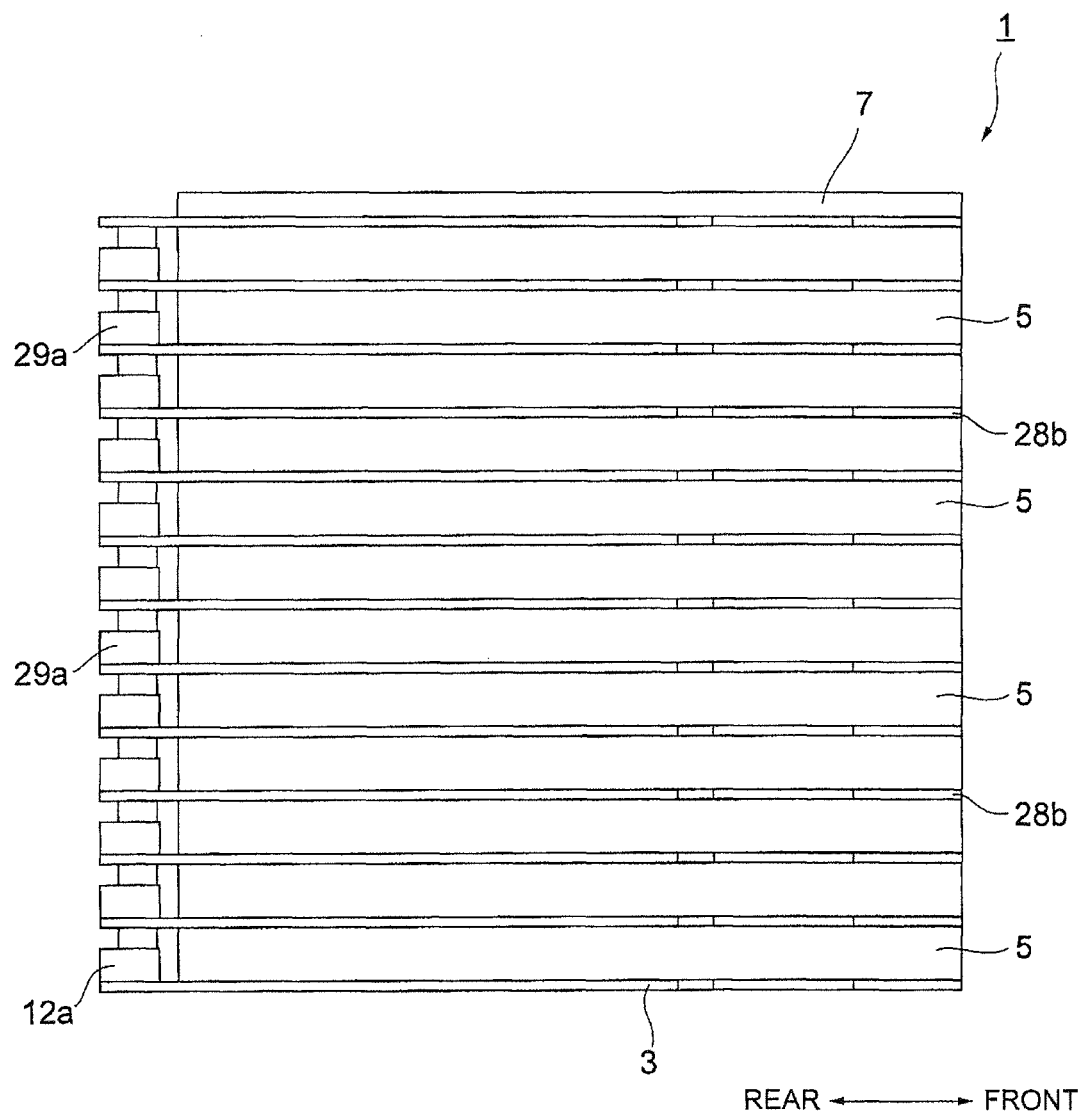
FIG. 2 is a side view of the storage container depicted in FIG. 1.
Figure 3:
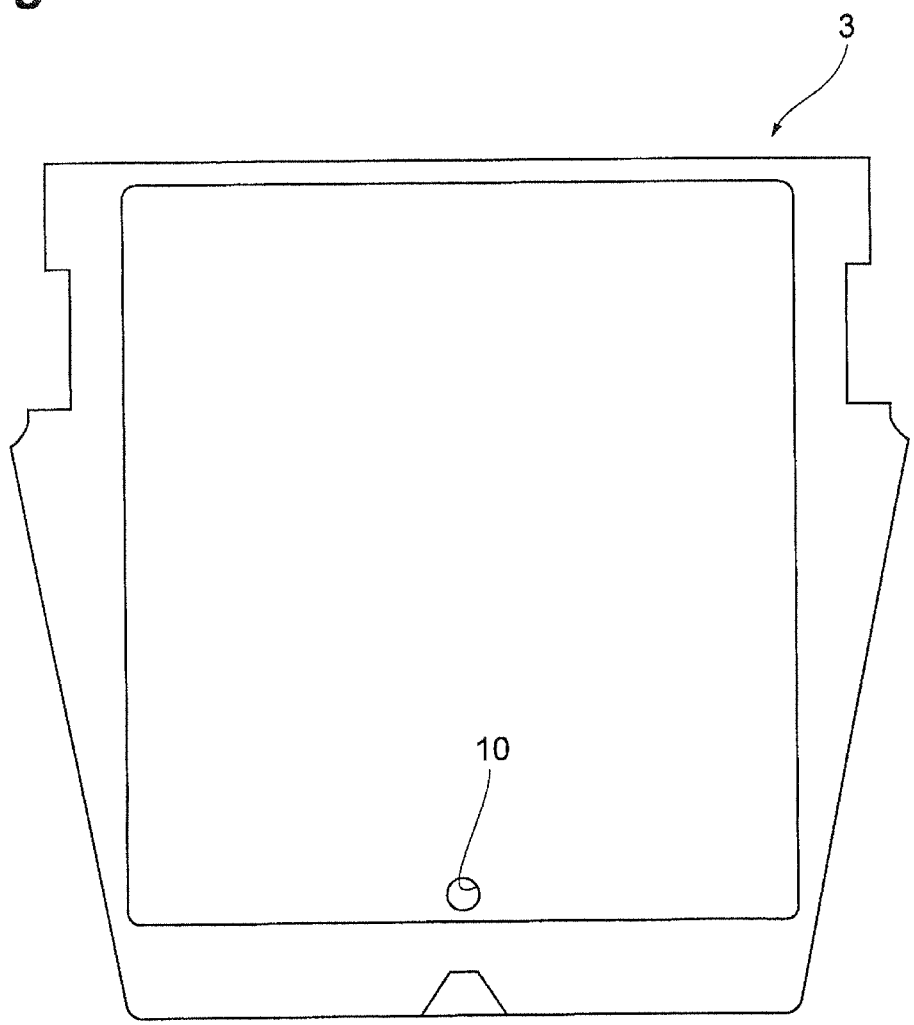
FIG. 3 is a bottom view of the storage container depicted in FIG. 1.
Figure 4:
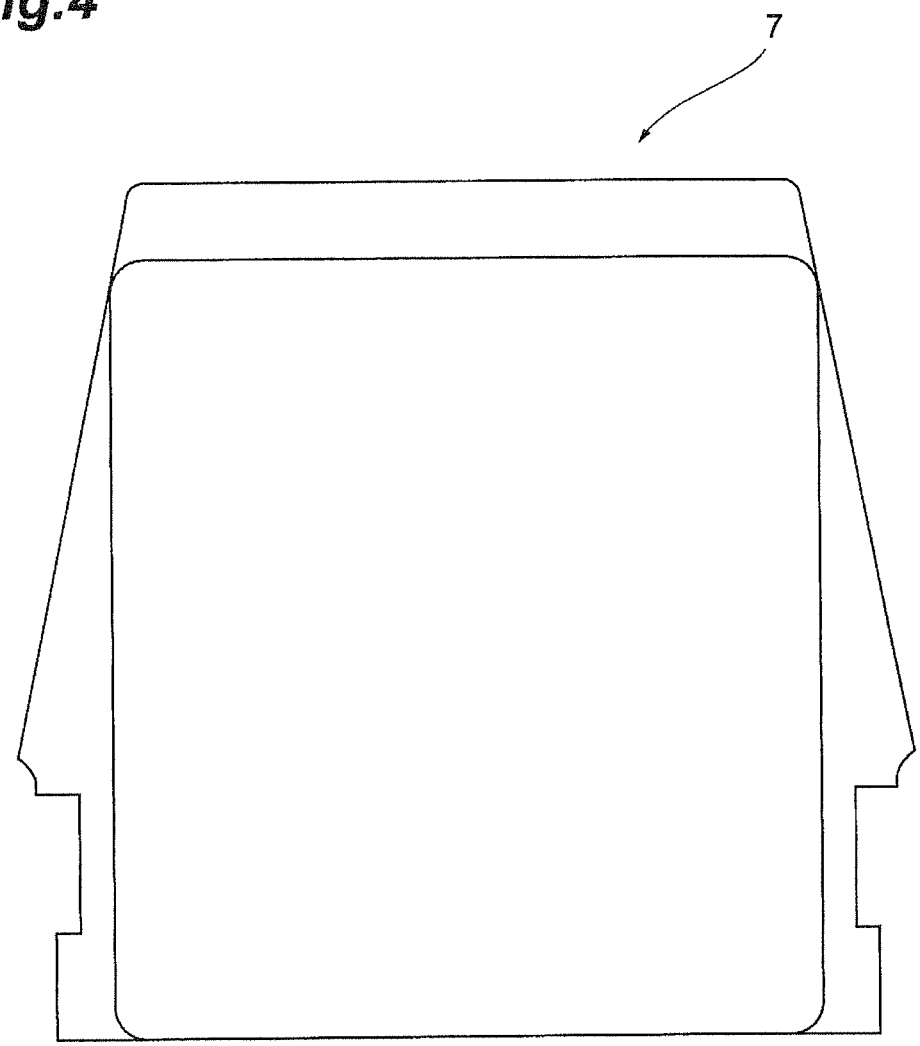
FIG. 4 is a top view of the storage container depicted in FIG. 1.

FIG. 1 is a front view of a storage container according to one embodiment. FIG. 2 is a side view of the storage container depicted in FIG. 1. FIG. 3 is a bottom view of the storage container depicted in FIG. 1. FIG. 4 is a top view of the storage container depicted in FIG. 1. This storage container 1 depicted in each drawing is, for example, a container that stores therein reticles (articles) in a clean environment. Herein, the articles stored in the storage container 1 are not limited to reticles.

The storage container 1 includes a bottom unit 3, storage units 5, and a lid unit 7. The storage units 5 are vertically stacked in a plurality of stages (herein, 11 stages). In the following description, the right and left in FIG. 1 are defined as "right" and "left", and the left and right in FIG. 2 are defined as "rear" and "front".

Figure 5:
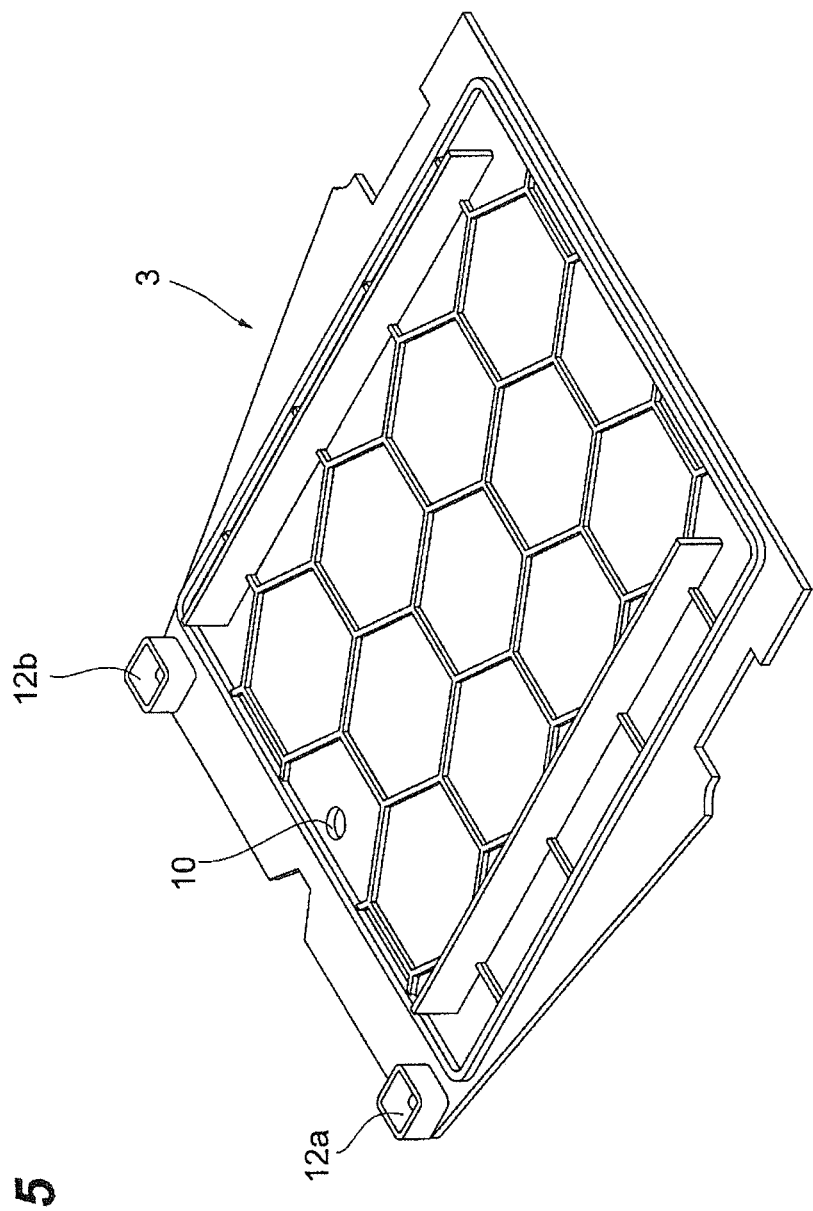
FIG. 5 is a perspective view illustrating a bottom unit.

FIG. 5 is a perspective view illustrating the bottom unit. As depicted in FIG. 5, the bottom unit 3 is a plate-like member. On the bottom unit 3, a supply portion 10 through which a purge gas is supplied into the storage container 1 is formed. The supply portion 10 is arranged in a rear of the bottom unit 3 and substantially at the center in the left-and-right direction. The supply portion 10 is a through hole having a substantially circular shape, for example, and passing through the bottom unit 3. The shape of the supply portion 10 is not limited to a particular one, and may also be rectangular or trapezoidal, for example. To the supply portion 10, the purge gas is supplied from a supply source (not depicted). The bottom unit 3 is provided with engaging portions 12a and 12b configured to engage with another storage unit 5. The engaging portions 12a and 12b are tubular members, arranged apart from each other in the left-and-right direction in the rear of the bottom unit 3.

Figure 6:
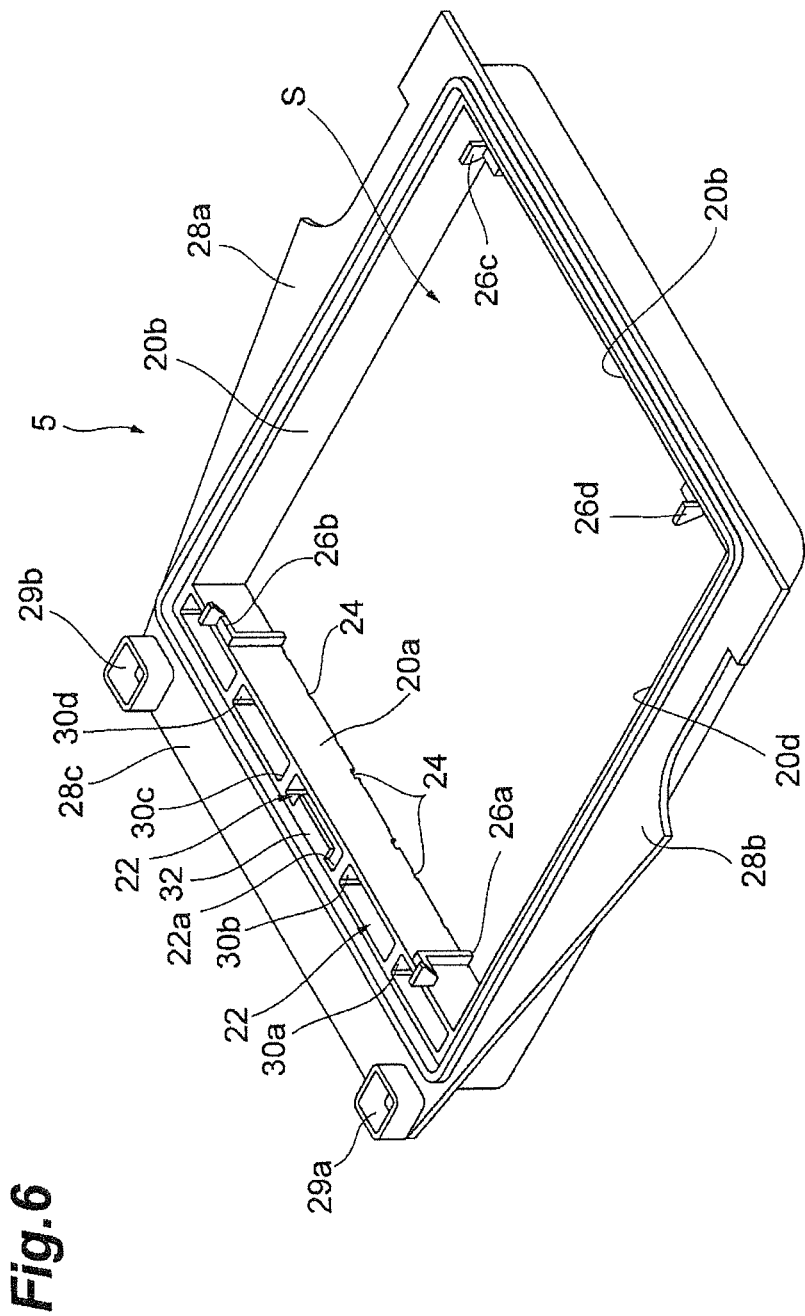
FIG. 6 is a perspective view illustrating a storage unit.

FIG. 6 is a perspective view illustrating one of the storage units. As depicted in FIG. 6, each storage unit 5 includes side portions 20a, 20b, 20c, and 20d, a duct portion 22, and an introducing portion 24. The side portions 20a to 20d define an accommodating region S having a substantially rectangular shape to accommodate a reticle. On the inner walls of the side portions 20a to 20d, supporting portions 26a, 26b, 26c, and 26d to support a reticle are provided. Outside the side portions 20a to 20d positioned in the left, right, and rear, flange portions 28a, 28b, and 28c are provided. To the flange portion 28c, engaging portions 29a and 29b configured to engage with storage unit 5 are provided. The engaging portions 29a and 29b are tubular members, arranged apart from each other in the left-and-right direction on the flange portion 28c.

The duct portion 22 forms a flow path for the purge gas. The duct portion 22 is arranged in a rear of the storage unit 5 and is positioned between the side portion 20a and the flange portion 28c. The duct portion 22 is provided along the left-and-right direction of the storage unit 5. The duct portion 22 is provided with partitions 30a, 30b, 30c, and 30d. The partitions 30a to 30d are arranged in plurality (herein, four) at predetermined intervals in the left-and-right direction in the duct portion 22. The duct portion 22 communicates with other duct portions 22 of other storage units 5 when the storage units 5 are stacked.

Figure 7:
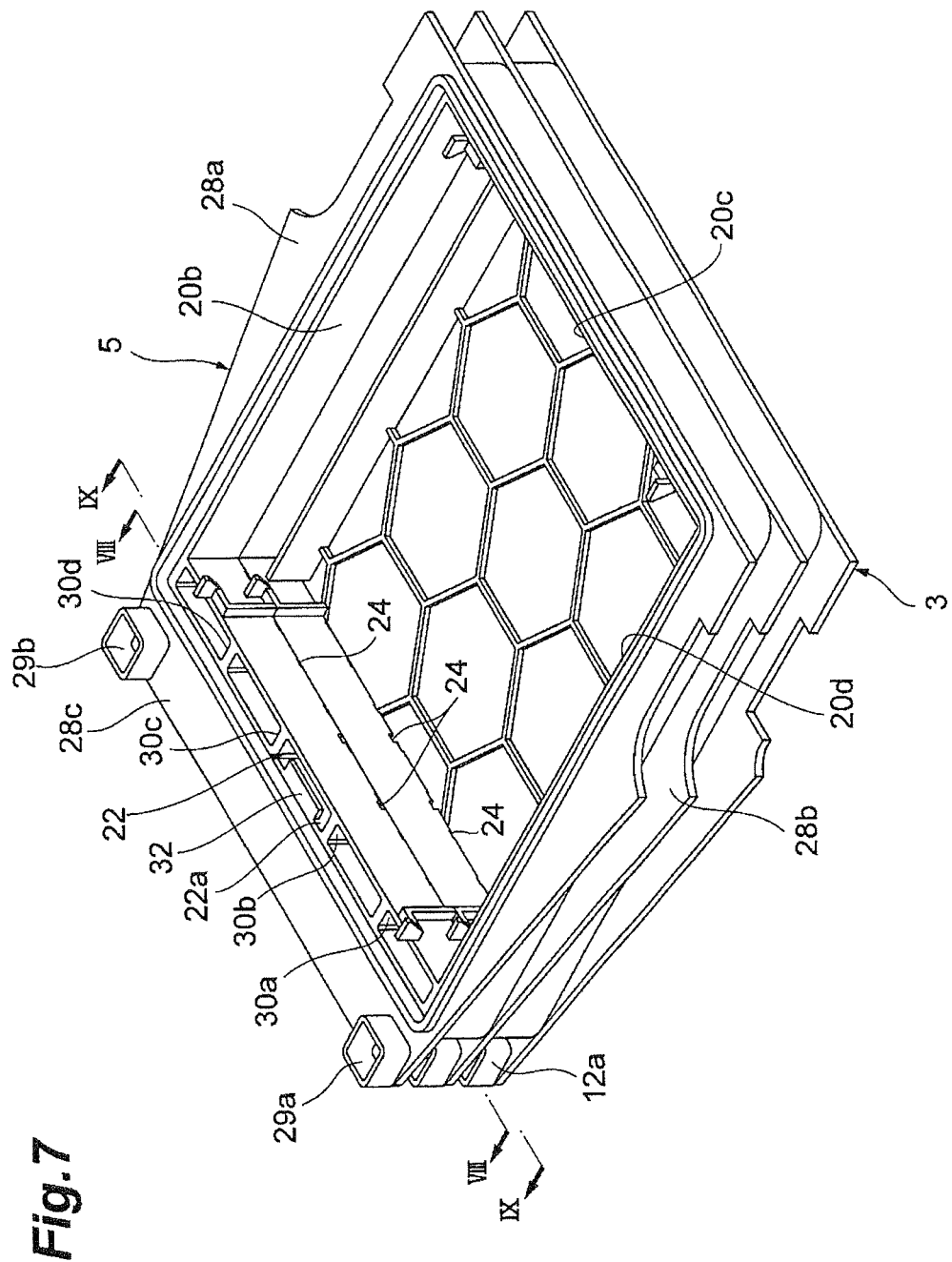
FIG. 7 is a perspective view illustrating a state in which the bottom unit and storage units are stacked.
Figure 8:
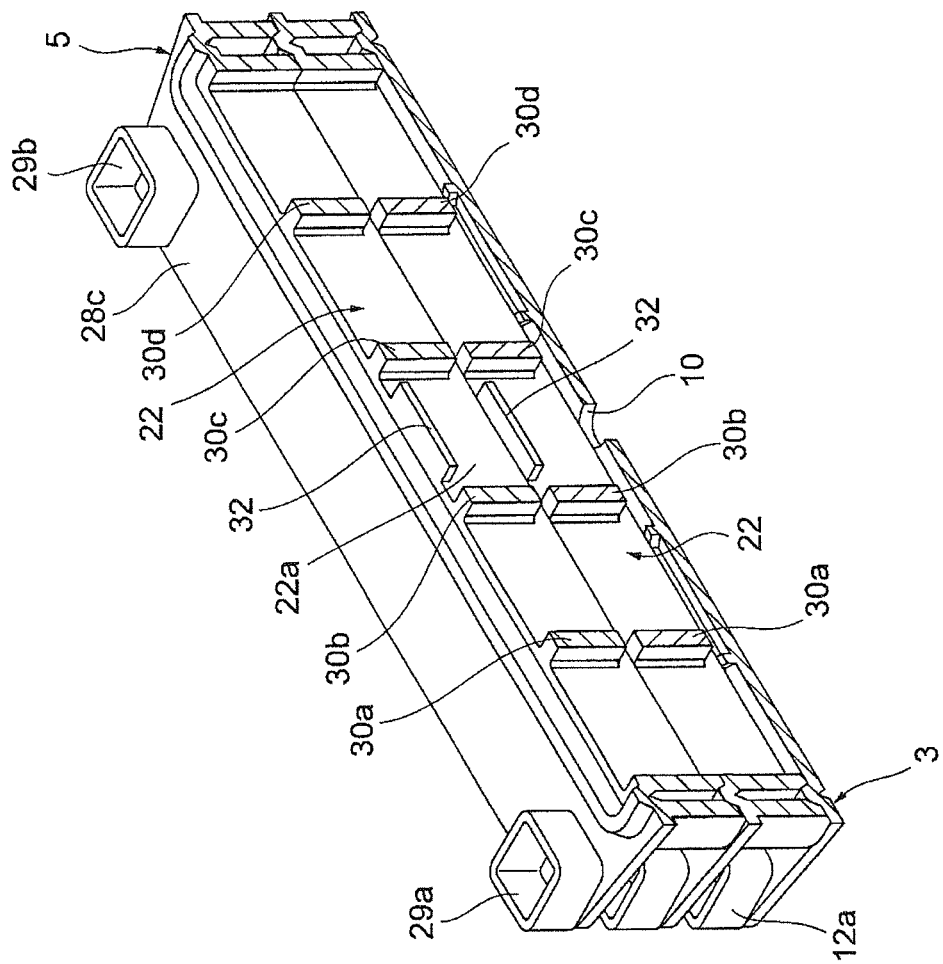
FIG. 8 is a diagram illustrating a sectional structure along the line VIII-VIII of FIG. 7.
Figure 9:
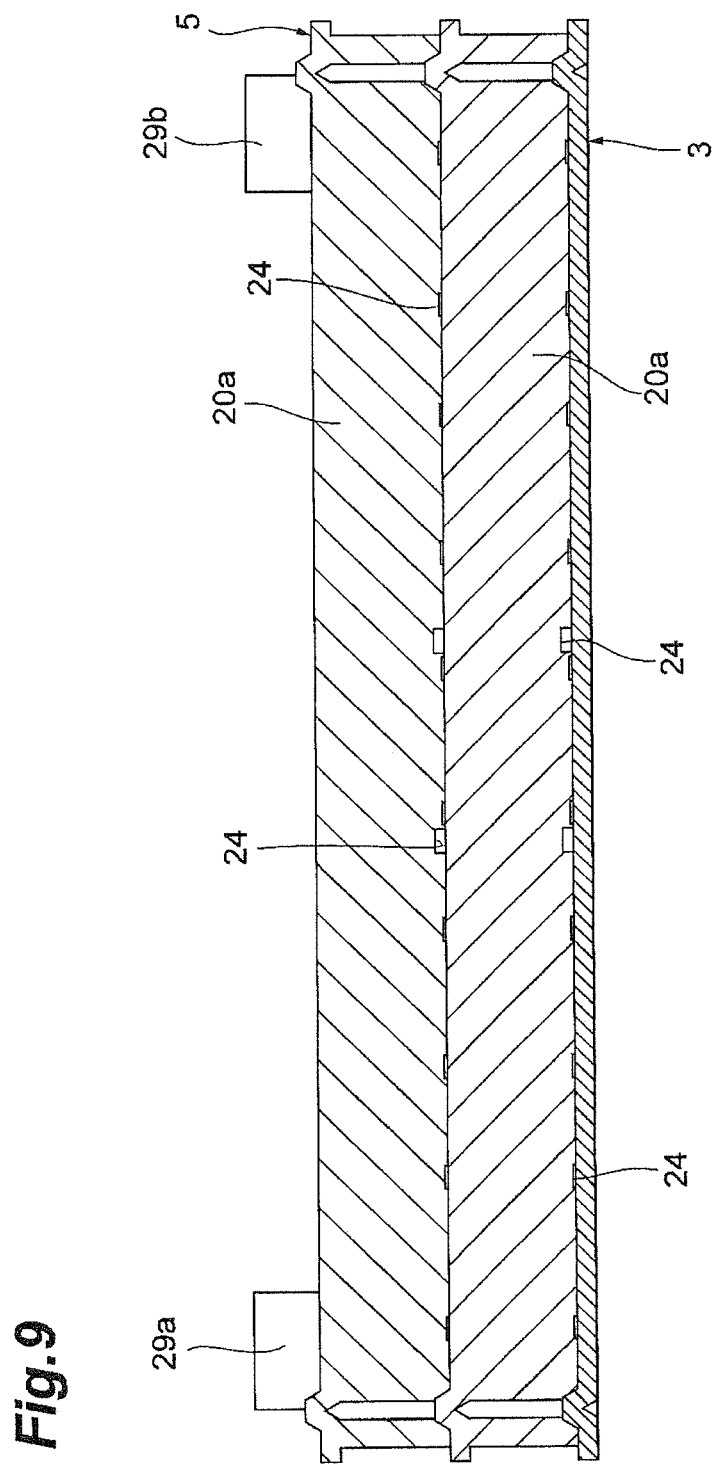
FIG. 9 is a diagram illustrating a sectional structure along the line IX-IX of FIG. 7.

FIG. 7 is a perspective view illustrating a state in which the bottom unit and the storage units are stacked. In FIG. 7, two storage units 5 are stacked on the bottom unit 3. FIG. 8 is a diagram illustrating a sectional structure along the line VIII-VIII of FIG. 7. FIG. 9 is a diagram illustrating a sectional structure along the line IX-IX of FIG. 7. As depicted in FIG. 8, the partitions 30a to 30d extend along the vertical direction. The lower ends of the partitions 30a to 30d each are positioned above the bottom surface of each storage unit 5. In other words, as depicted in FIG. 8, spaces are defined between the partitions 30a to 30d and the neighboring partitions 30a to 30d when the storage units 5 are stacked. Accordingly, in the duct portion 22, flow paths for the purge gas flowing in the left-and-right direction are formed.

In the present embodiment, each of the duct portions 22 of some storage units 5 out of a plurality of storage units 5 that are vertically stacked is provided with a diffusion member 32. Specifically, for example, out of a plurality of storage units 5, in storage units 5 arranged on a lower side of the storage container 1, the duct portions 22 each are provided with the diffusion member 32. The diffusion member 32 is a plate-like member (protruding piece) protruding from an inner wall 22a of the duct portion 22 and has, for example, a rectangular shape. The shape of the diffusion member 32 is not limited to a particular one, and may also be circular or trapezoidal, for example. The diffusion member 32 may be provided in plurality.

In the present embodiment, the diffusion member 32 is arranged in a position corresponding to the supply portion 10 of the bottom unit 3, i.e., at the center of the duct portion 22. In other words, the diffusion member 32 is arranged on an extended line in the inflow direction of the purge gas supplied from the supply portion 10.

The introducing portion 24 is formed on the side portion 20a. The introducing portion 24 is a notch that communicably connects the duct portion 22 with the accommodating region S. The introducing portion 24 is formed at the lower end of the side portion 20a and has a concave shape opening downward. The shape of the introducing portion 24 is not limited to a particular one, and may also be semicircular or trapezoidal, for example. The introducing portion 24 is formed in plurality (herein, 12) at predetermined intervals in the left-and-right direction. The purge gas is introduced from the duct portion 22 to the accommodating region S through the introducing portions 24.

Figure 10:
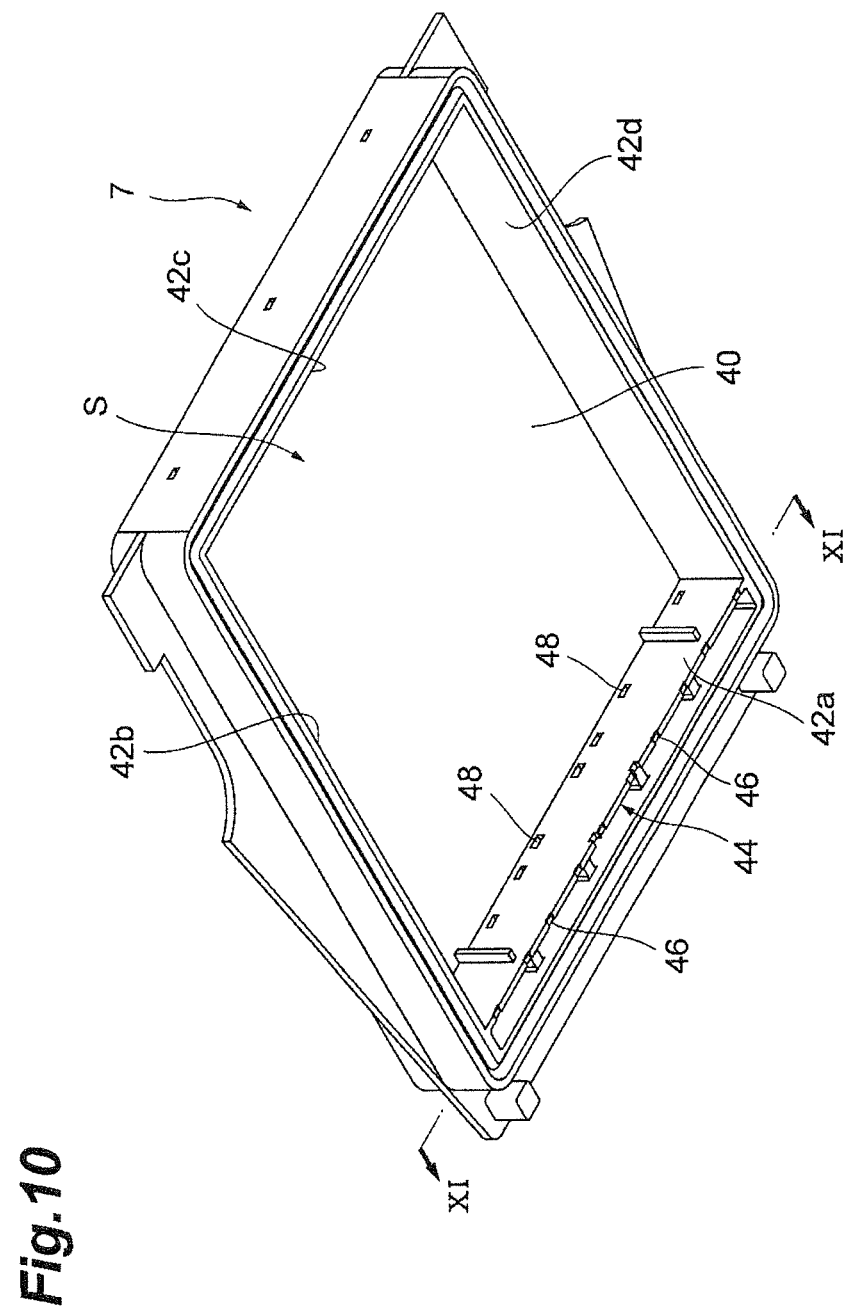
FIG. 10 is a perspective view illustrating a lid unit.
Figure 11:
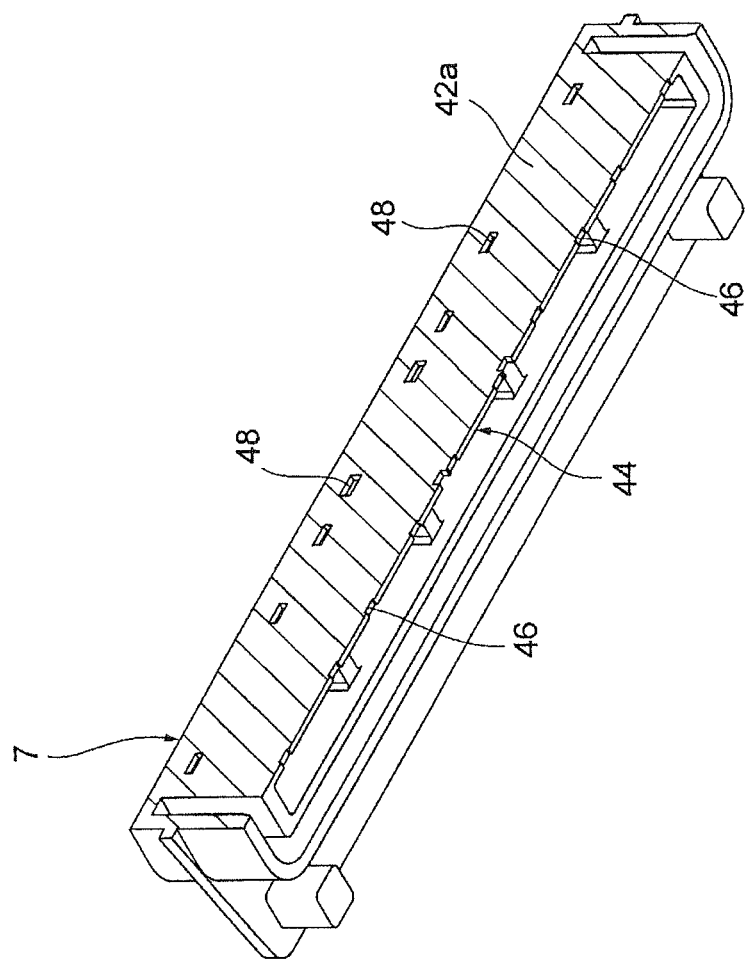
FIG. 11 is a diagram illustrating a sectional structure along the line XI-XI of FIG. 10.

FIG. 10 is a perspective view illustrating the lid unit. FIG. 11 is a diagram illustrating a sectional structure along the line XI-XI of FIG. 10. As depicted in FIG. 1, the lid unit 7 is arranged at the top of the storage units 5. The lid unit 7 has a lid plate 40, side portions 42a, 42b, 42c, and 42d, a duct portion 44, an introducing portion 46, and an introducing hole 48.

The lid plate 40 is a plate-like member. Portions of the lid plate 40 outside the side portions 42a, 42b, and 42d serve as flange portions. The side portions 42a to 42d define an accommodating region S that accommodates a reticle. The duct portion 44 forms a flow path for the purge gas. The duct portion 44 is arranged in the rear. When the lid unit 7 is stacked on a storage unit 5, the duct portion 44 communicates with the duct portion 22 of the storage unit 5.

The introducing portion 46 is formed on the side portion 42a. The introducing portion 46 is a notch that communicably connects the duct portion 44 with the accommodating region S. The introducing portion 46 is formed at the lower end of the side portion 42a and has a concave shape opening downward. The introducing portion 46 is formed in plurality (herein, 12) at predetermined intervals in the left-and-right direction.

The introducing hole 48 is formed on the side portion 42a. The introducing hole 48 is a through hole that communicably connects the duct portion 44 with the accommodating region S. The introducing hole 48 is formed at the upper end of the side portion 42a, and the cross-section thereof is rectangular, for example. The introducing hole 48 is formed in plurality (herein, eight) at predetermined intervals in the left-and-right direction. The purge gas is introduced from the duct portion 44 to the accommodating region S through the introducing portions 46 and the introducing holes 48.

The following describes a flow of the purge gas in the storage container 1. Into the storage container 1, the purge gas is supplied from the supply portion 10 of the bottom unit 3. The purge gas supplied from the supply portion 10 flows into the duct portion 22. At this time, at the duct portion 22 of the storage unit 5, the purge gas is diffused by the diffusion member 32. The purge gas diffused by the diffusion member 32, having a reduced flow velocity, passes through the lower portions of the partitions 30a to 30d in the duct portion 22 and is diffused throughout the duct portion 22. The purge gas is then introduced into the accommodating region S of the storage unit 5 through the introducing portions 24.

As described in the foregoing, in the storage container 1 according to the present embodiment, the diffusion members 32 are arranged in the flow path for the purge gas in the duct portions 22. Accordingly, in the storage container 1, the purge gas is diffused by the diffusion members 32. Because of this, in the storage container 1, the flow velocity can be reduced by, for example, arranging the diffusion members 32 in sections where the flow velocity is high. Thus, in the storage container 1, a uniform flow velocity of the purge gas can be achieved. Consequently, in the storage container 1, the purge gas spreads over a wide area even into sections where the flow velocity is generally high, and thus variations in the purge gas atmosphere can be reduced in each storage unit 5.

In the present embodiment, each diffusion member 32 is a plate-like member protruding from the inner wall 22a of the duct portion 22. With this member, in the storage container 1, the purge gas can be diffused by a simple configuration, and thus a uniform flow velocity of the purge gas can be achieved with the simple configuration.

In the present embodiment, the diffusion members 32 are arranged on the extended line in the inflow direction of the purge gas supplied from the supply portion 10. The flow velocity of the purge gas is high in the inflow direction from the supply portion 10. Thus, by arranging the diffusion members 32 on the extended line in the inflow direction of the purge gas, the purge gas can be effectively diffused, whereby a uniform flow velocity can be achieved.

In the present embodiment, the diffusion members 32 are provided in the storage units 5 arranged near the supply portion 10. The flow velocity of the purge gas is high in sections near the supply portion 10, and the flow velocity decreases in sections apart from the supply portion 10. In the storage container 1, the diffusion members 32 are provided in the storage units 5 arranged on the lower side of the storage container 1 (on the supply portion 10 side). Accordingly, in the storage container 1, by diffusing the purge gas with the diffusion members 32, the flow velocity of the purge gas in the sections near the supply portion 10 can be reduced. Thus, in the storage container 1, a uniform flow velocity of the purge gas can be suitably achieved.

The present invention is not limited to the above-described embodiments. For example, in the above-described embodiments, a plate-like member protruding from the inner wall 22a of the duct portion 22 has been described as one example of each diffusion member 32, but the diffusion member may be configured otherwise. For example, the diffusion member may be a member that narrows the flow path of the duct portion. The essential point is that the diffusion member may be any means for diffusing the purge gas to change the flow velocity of the purge gas.

In the above-described embodiments, a configuration in which the diffusion members 32 are arranged on the lower side of the storage container 1, i.e., near the supply portion 10 for the purge gas has been described as one example of a preferred configuration, but the diffusion members 32 may be provided to all of the storage units 5. Alternatively, the diffusion members 32 do not have to be continuously provided to the storage units 5 stacked. For example, the diffusion members 32 may be provided to every other stage (e.g., to the storage unit 5 at the first stage and the storage unit 5 at the third stage, etc.).

In addition to the above-described embodiments, the area of each diffusion member 32 may be changed. Specifically, depending on the distance from the supply portion 10, the area of each diffusion member 32 may be changed. More specifically, for example, the area of a diffusion member 32 arranged near the supply portion 10 may be set larger, and the area of another diffusion member 32 arranged apart from the supply portion 10 may be set smaller.

REFERENCE SIGNS LIST

1 . . . storage container, 5 . . . storage unit, 22 . . . duct portion, 24 . . . introducing portion, 32 . . . diffusion member, S . . . accommodating region

The invention claimed is:

1. A storage container comprising a plurality of stages of storage units each having an accommodating region to accommodate an article, the storage container comprising:
   a supply portion configured to supply a purge gas;
   a duct portion configured to communicate with other duct portions of other storage units throughout the plurality of stages of storage units and serve as a flow path for the purge gas supplied from the supply portion when the plurality of storage units are stacked; and
   an introducing portion configured to communicably connect the duct portion with the accommodating region and introduce the purge gas to the accommodating region, wherein
   in the flow path for the purge gas in the duct portion, a diffusion member is arranged such that a uniform flow velocity of the purge gas can be achieved,
   the duct portion is formed by each of the plurality of stages of storage units in a stacked state so that the duct portion passes through all of the plurality of stages of storage units, and
   the diffusion member protrudes from an inner wall of the duct portion.

2. The storage container according to claim 1, wherein the diffusion member is a plate-like member protruding from an inner wall of the duct portion.

3. The storage container according to claim 1, wherein the diffusion member is arranged on an extended line in an inflow direction of the purge gas supplied from the supply portion.

4. The storage container according to claim 1, wherein the diffusion member is provided in at least one of the storage units arranged near the supply portion.

5. The storage container according to claim 2, wherein the diffusion member has an area that is changed depending on a distance from the supply portion.

* * * * *